(12) United States Patent
Lin et al.

(10) Patent No.: US 7,206,206 B2
(45) Date of Patent: Apr. 17, 2007

(54) RADIATOR STRUCTURE

(75) Inventors: Shu-Ju Lin, Taipei (TW); Win-Haw Chen, Taipei (TW)

(73) Assignee: Inventec Corporation, Taipei (TW)

( * ) Notice: Subject to any disclaimer, the term of this patent is extended or adjusted under 35 U.S.C. 154(b) by 401 days.

(21) Appl. No.: 10/874,584

(22) Filed: Jun. 24, 2004

(65) Prior Publication Data

US 2005/0286233 A1 Dec. 29, 2005

(51) Int. Cl.
*H05K 7/20* (2006.01)
*H01L 23/34* (2006.01)
*F28F 7/00* (2006.01)

(52) U.S. Cl. .................. 361/719; 257/719; 257/718; 165/80.3; 174/16.3

(58) Field of Classification Search ............... 361/719; 257/718–719
See application file for complete search history.

(56) References Cited

U.S. PATENT DOCUMENTS

| 4,509,839 | A | * | 4/1985 | Lavochkin | 257/718 |
| 5,808,236 | A | * | 9/1998 | Brezina et al. | 174/16.3 |
| 5,831,829 | A | * | 11/1998 | Lin | 361/704 |
| 6,496,371 | B2 | * | 12/2002 | Winkel et al. | 361/703 |
| 6,518,507 | B1 | * | 2/2003 | Chen | 174/252 |
| 6,707,672 | B2 | * | 3/2004 | Liu | 361/704 |
| 6,785,136 | B2 | * | 8/2004 | Chang et al. | 361/704 |
| 6,822,869 | B2 | * | 11/2004 | Huang et al. | 361/704 |
| 2005/0044674 | A1 | * | 3/2005 | Chen et al. | 24/457 |
| 2006/0042783 | A1 | * | 3/2006 | Hsu | 165/80.3 |

* cited by examiner

*Primary Examiner*—Lisa Lea-Edmonds
*Assistant Examiner*—Zachary Pape
(74) *Attorney, Agent, or Firm*—Birch, Stewart, Kolasch & Birch, LLP (57) ABSTRACT

A radiator structure includes a radiator frame, a radiator and a plurality of elastic latch members. The radiator frame is mounted onto a main board corresponding to an electronic element, and has a plurality of coupling sections and an opening corresponding to the electronic element and the surface of the electronic element exceeds its peripheral edges. The radiator is mounted on the radiator frame in contact with the surface of the electronic element, and has a plurality of latch sections corresponding to the coupling sections. The elastic latch member coupled on the latch section is bent to form a force applying section, a latch arm and a swinging arm. After the force applying section receives a force, the swinging arm coupled on the latch section is turned to enable the latch arm to latch on the coupling section thereby to anchor the radiator on the radiator frame to disperse heat.

4 Claims, 10 Drawing Sheets

RADIATOR STRUCTURE

FIELD OF THE INVENTION

The present invention relates to a radiator structure adopted for use on heat generating electronic elements of a computer system.

BACKGROUND OF THE INVENTION

The operation temperature of electronic elements in a computer system affects normal functions of the system. To achieve stable operation of the computer system, the computer system has to include a heat dissipation design. In the computer system, the central processing unit (CPU) is the main processing center and generates the highest operation temperature. Hence it also has the greatest demand for heat dissipation.

The conventional heat dissipation design for the CPU generally includes mounting a radiator on the CPU and installing a radiation fan above the radiator. Heat generated by the CPU during operation transfers to the radiator. The radiation fan generates airflow into the radiator to perform heat exchange and disperse heat. In such a design, coupling of the radiator and the CPU affects heat transfer. Hence the radiator has to be in contact closely with the CPU to achieve effective heat transfer. The present radiator and CPU are two separate elements. Mounting the radiator onto the CPU relies on a coupling fixture. Most of the known coupling methods adopt a U-shaped clip with latch holes on two ends, to couple with hooks located on two sides of a CPU anchor dock (or radiator anchor dock). The U-shaped clip applies a compression force downward like a bridge, to make the radiator in contact with the CPU. Users generally have to exert a certain force to latch another end of the U-shaped clip on the CPU anchor dock. While such a design allows the radiator to generate a certain compression force, it is not easy for users to install. Moreover, applying the force improperly (not evenly) could result in damage of the CPU or the main board, where the CPU is mounted. In addition, during installation, pressing the U-shaped clip requires a greater working environment. This is not convenient especially when the machine case is small.

SUMMARY OF THE INVENTION

The primary object of the invention is to provide a radiator structure for coupling with electronic elements to facilitate heat dissipation.

The radiator structure according to the invention includes a radiator frame, a radiator and a plurality of elastic latch members. The radiator frame is mounted onto a main board corresponding to an electronic element (usually a CPU). It has a plurality of coupling sections and an opening corresponding to the electronic element. The surface of the electronic element exceeds the peripheral edges of the opening. The radiator is mounted on the radiator frame in contact with the surface of the electronic element. It has a plurality of latch sections, corresponding to the coupling sections. The elastic latch members are coupled on the latch sections and are bent to form respectively a force applying section, a latch arm and a swinging arm. The force applying section receives a force to turn the swinging arm coupled on the latch section. The latch arm is latched on the coupling section thereby anchoring the radiator on the radiator frame. The structure of the invention can be easily installed on an electronic element to disperse the generated heat.

The radiator structure provided by the invention has the following features and characteristics:

1. The radiator frame is simply structured and easy to fabricate.
2. The radiator and elastic latch arm are coupled to become one body. It can be easily installed on the radiator frame to facilitate heat dissipation.
3. The elastic latch arm of the invention needs only a small operation environment while being pressed, thus may be adapted to a smaller machine case.
4. The dimension of the radiator is alterable according to requirements.

Further scope of the applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DESCRIPTION OF THE PREFERRED EMBODIMENTS

Figure 1:
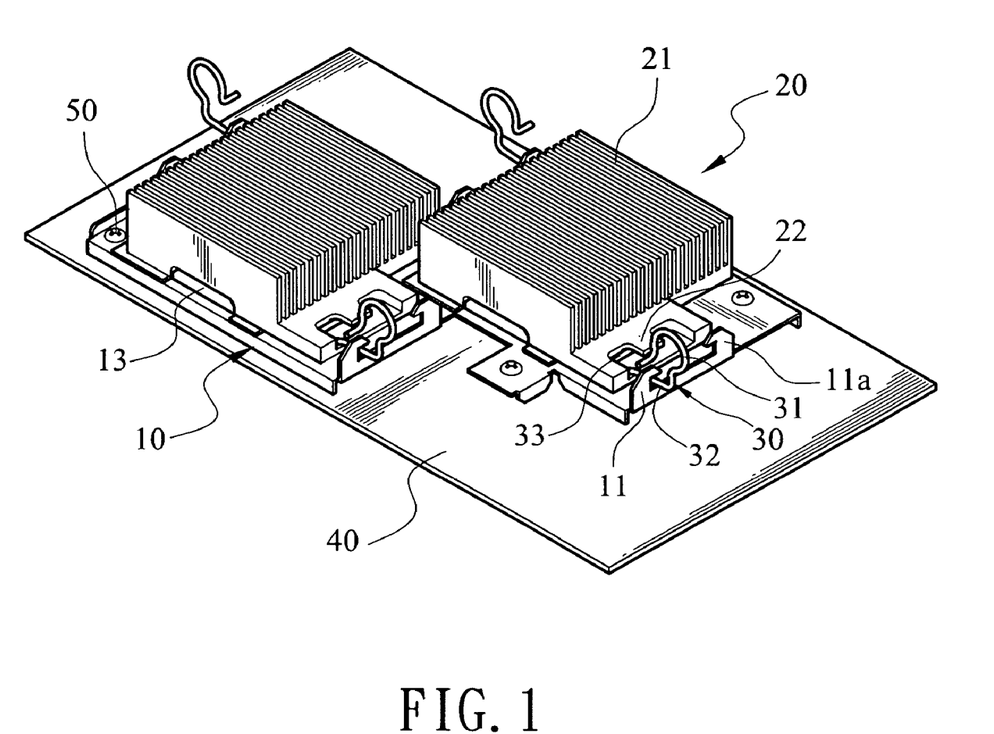
FIG. 1 is a schematic view of the first embodiment of the invention mounted onto a CPU.

FIG. 1 shows the first embodiment of the invention mounted onto a CPU. The radiator structure of the invention mainly aims to couple a radiator 20 on an electronic element, which may be a main element CPU 41 on a main board 40 of a computer system (not shown in the drawing), to disperse heat generated by the CPU 41. The radiator 20 is in contact with the CPU 41. Heat energy of the CPU 41 is transferred to radiation fins 21 on the radiator 20, to allow the heat energy of the CPU 41 to be dispersed.

Figure 2:
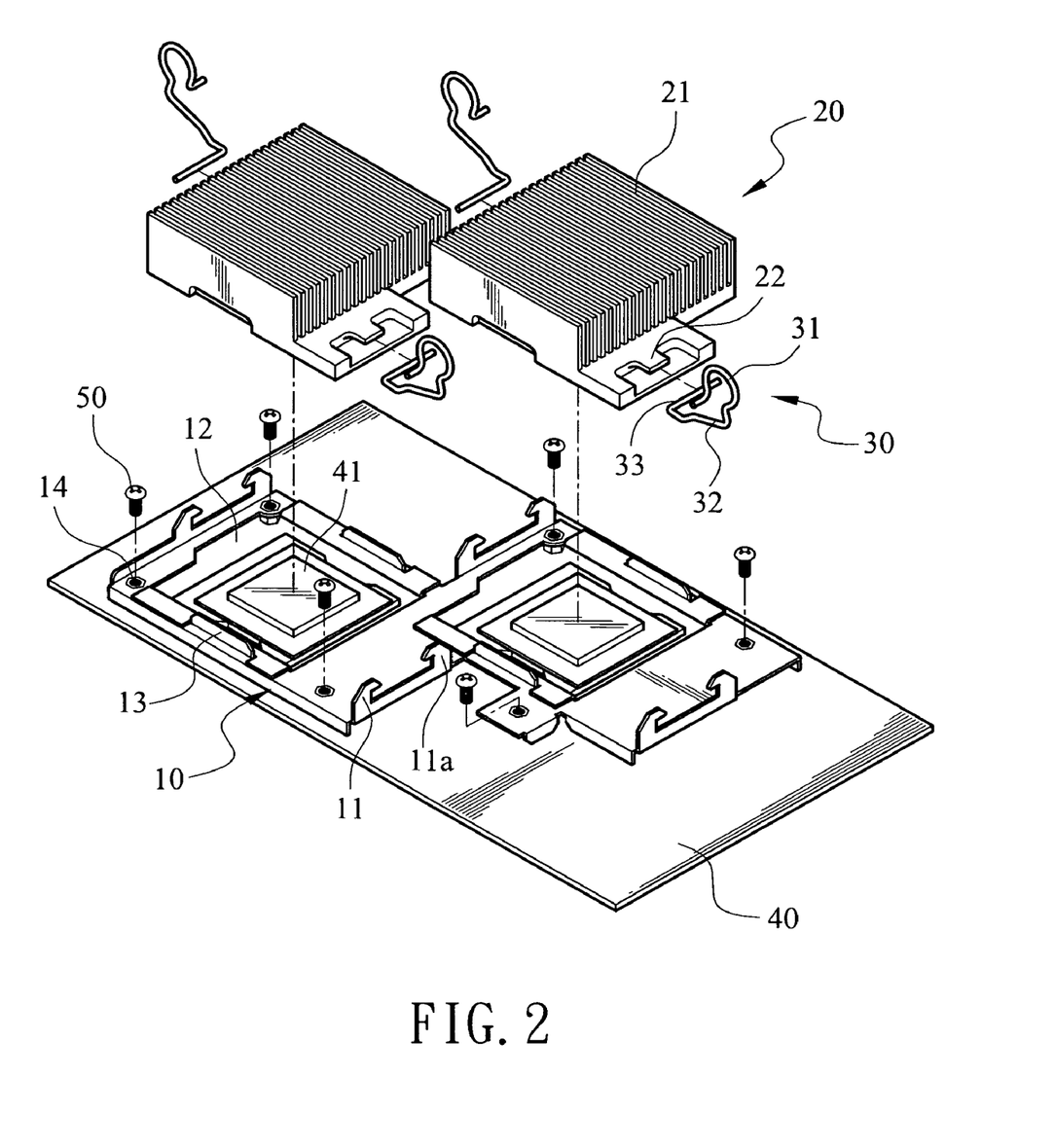
FIG. 2 is an exploded view of the first embodiment of the invention.

FIG. 2 shows an exploded view of the first embodiment. The first embodiment includes a radiator frame 10, a radiator 20 and a plurality of elastic latch members 30. The radiator frame 10 is mounted onto the main board 40 corresponding to the CPU 41. It has a plurality of coupling sections 11 and a plurality of retaining members 13, which confine the radiator 20 from moving in the radiator frame 10. It also has an opening 12, corresponding to the CPU 41 and a plurality of screw holes 14. The opening 12 enables the CPU 41 to be exposed. The surface of the CPU 41 exceeds the peripheral edges of the opening 12. The screw holes 14 are coupled with screws 50 to fasten the radiator frame 10 to the main board 40.

The radiator 20 is mounted on the radiator frame 10 and is in contact with the surface of the CPU 41. It is confined from moving by the retaining members 13. It also has a plurality of latch sections 22 corresponding to the coupling sections 11.

The elastic latch members 30 are coupled on the latch sections 22 and are bent to form respectively a force applying section 31, a latch arm 32 and a swinging arm 33. The force applying section 31 receives a force to turn the swinging arm 33 coupled on the latch section 22 to latch the latch arm 32 on the coupling section 11 thereby anchoring the radiator 20 on the radiator frame 10.

Figure 3A:
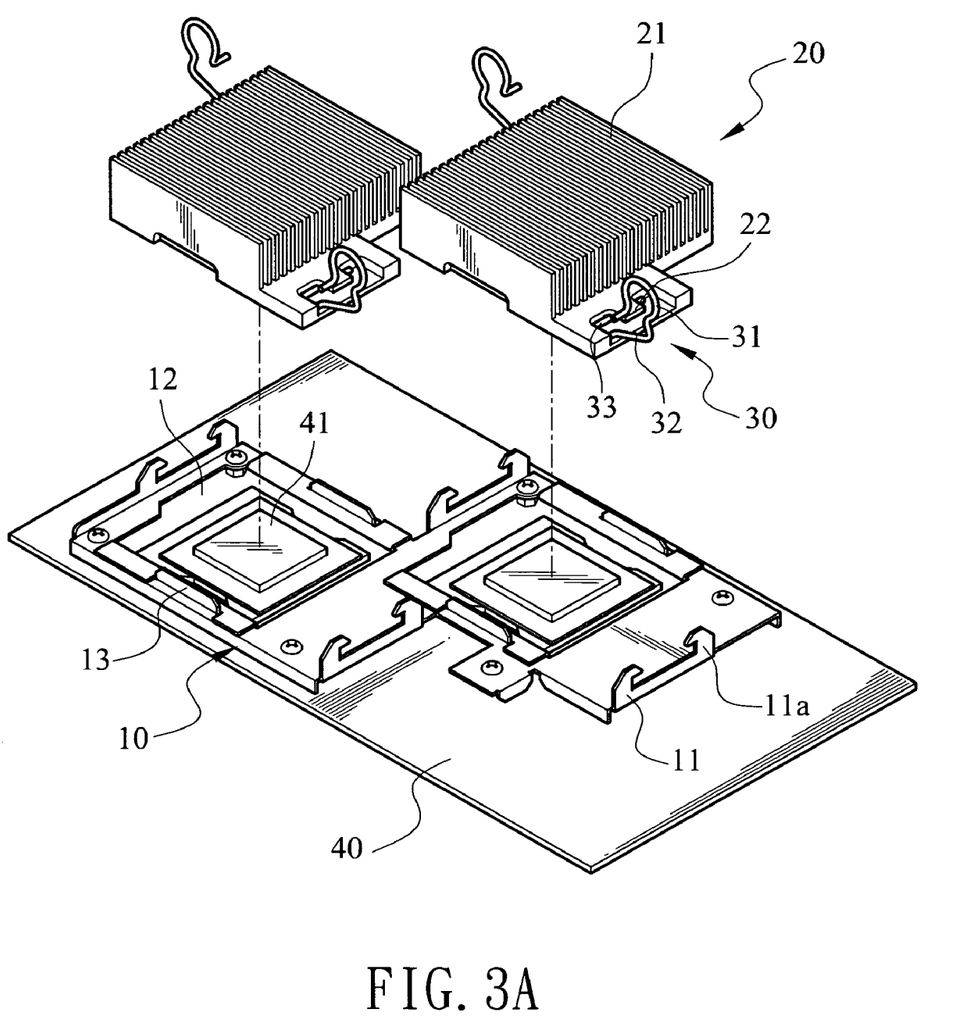
FIGS. 3A, 3B and 3C are schematic views of the first embodiment of the invention in assembly conditions.
Figure 3B:
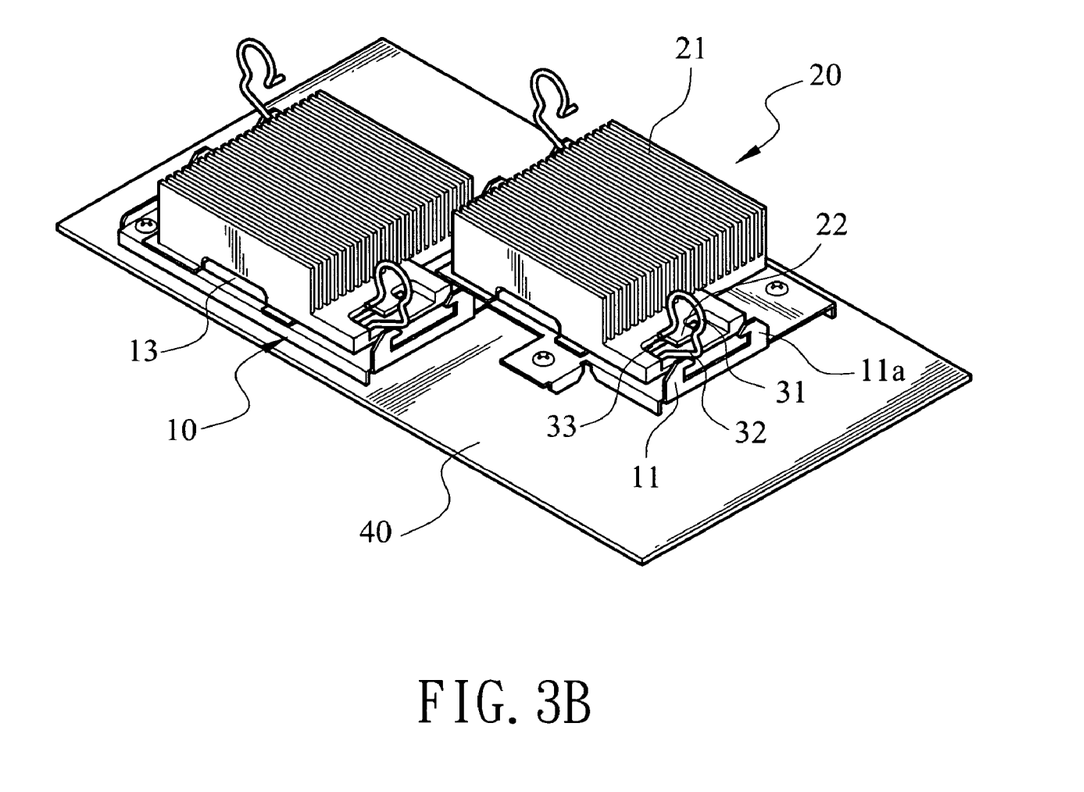
Figure 3C:
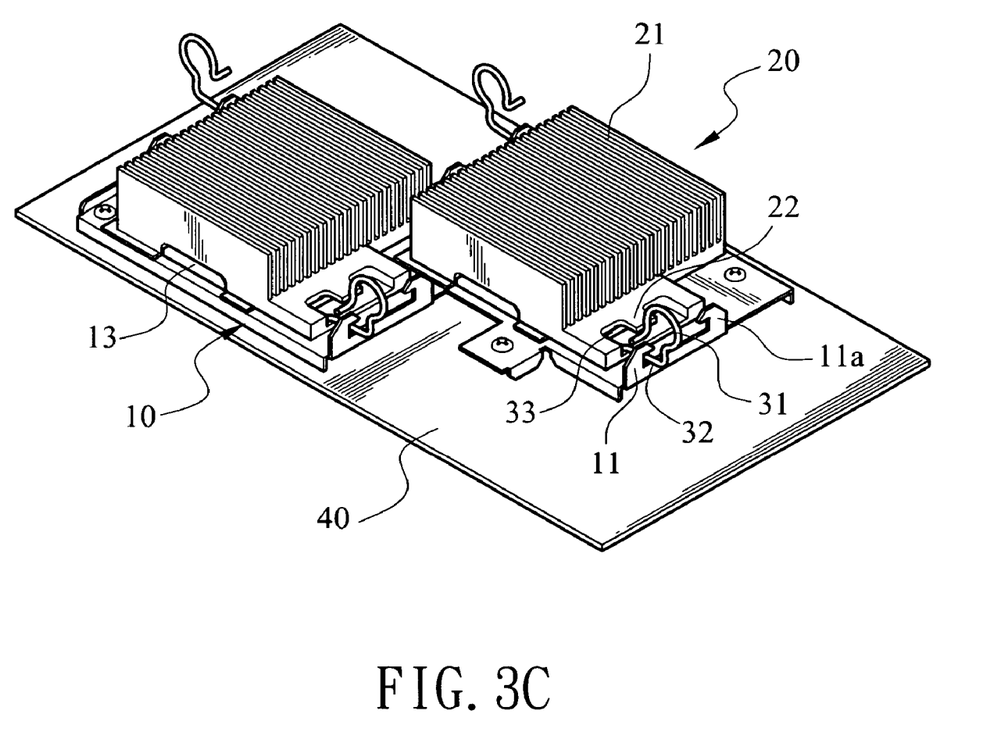

FIGS. 3A, 3B and 3C show schematic views of the first embodiment of the invention in assembly conditions. The radiator frame 10 is fastened to the main board 40 by screwing the screws 50 in the screw holes 14. The swinging arm 33 of the elastic latch member 30 is engaged with the latch section 22 of the radiator 20 in a turning manner, thereby, can fasten the radiator 20 to the radiator frame 10 and confine the radiator 20 to the retaining members 13 without moving. Exert a force on the force applying section 31 to turn the elastic latch member 30 about the swinging arm 33 and move the elastic latch member 30 towards the coupling section 11 and latch the latch arm 32 on the coupling section 11. Thereby, the radiator 20 is anchored on the radiator frame 10 and the radiator 20 is in contact with the CPU 41. Thus heat energy generated by the CPU 41 is transferred to the radiation fins 21 of the radiator 20 and dispersed.

Figure 4:
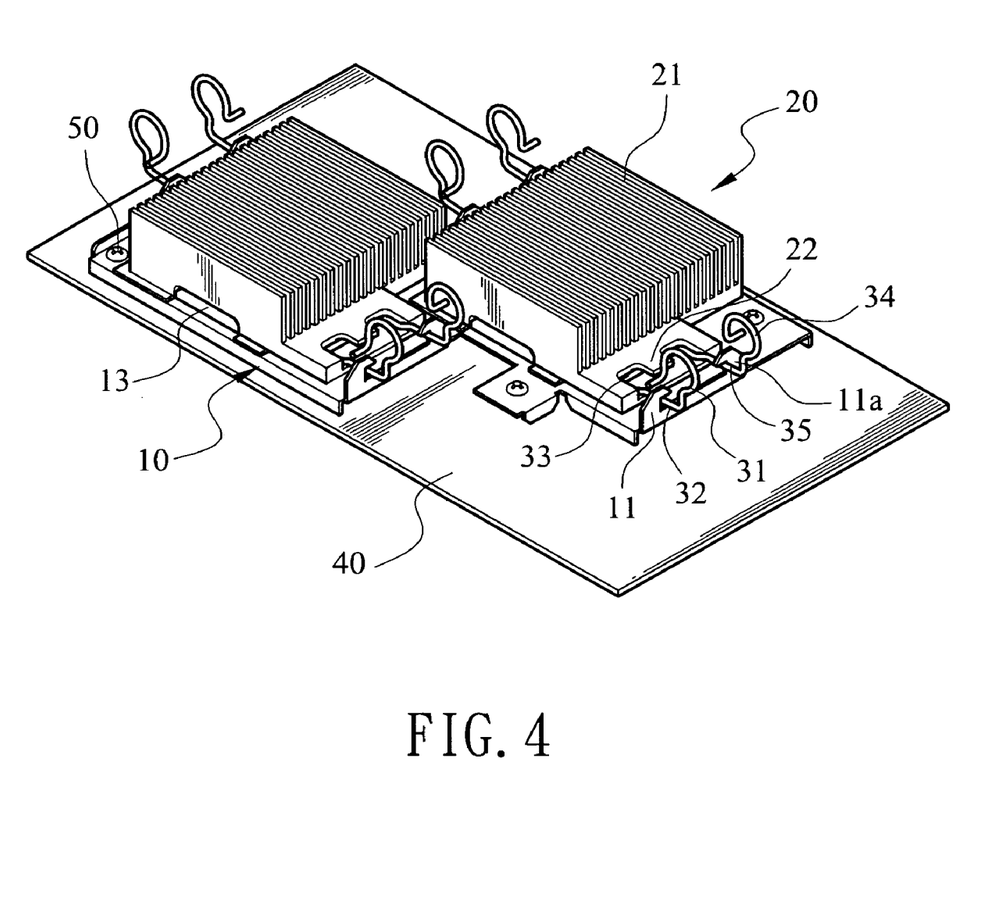
FIG. 4 is a schematic view of the second embodiment of the invention mounted onto a CPU.

FIG. 4 shows the second embodiment of the invention mounted onto a CPU. The radiator structure of the invention mainly aims to couple a radiator 20 on an electronic element which may be a main element CPU 41 on a main board 40 of a computer system (not shown in the drawing) to disperse heat generated by the CPU 41. The radiator 20 is in contact with the CPU 41. Heat energy of the CPU 41 is transferred to radiation fins 21 on the radiator 20, to allow distribution of the heat energy of CPU 41 to a larger area.

Figure 5:
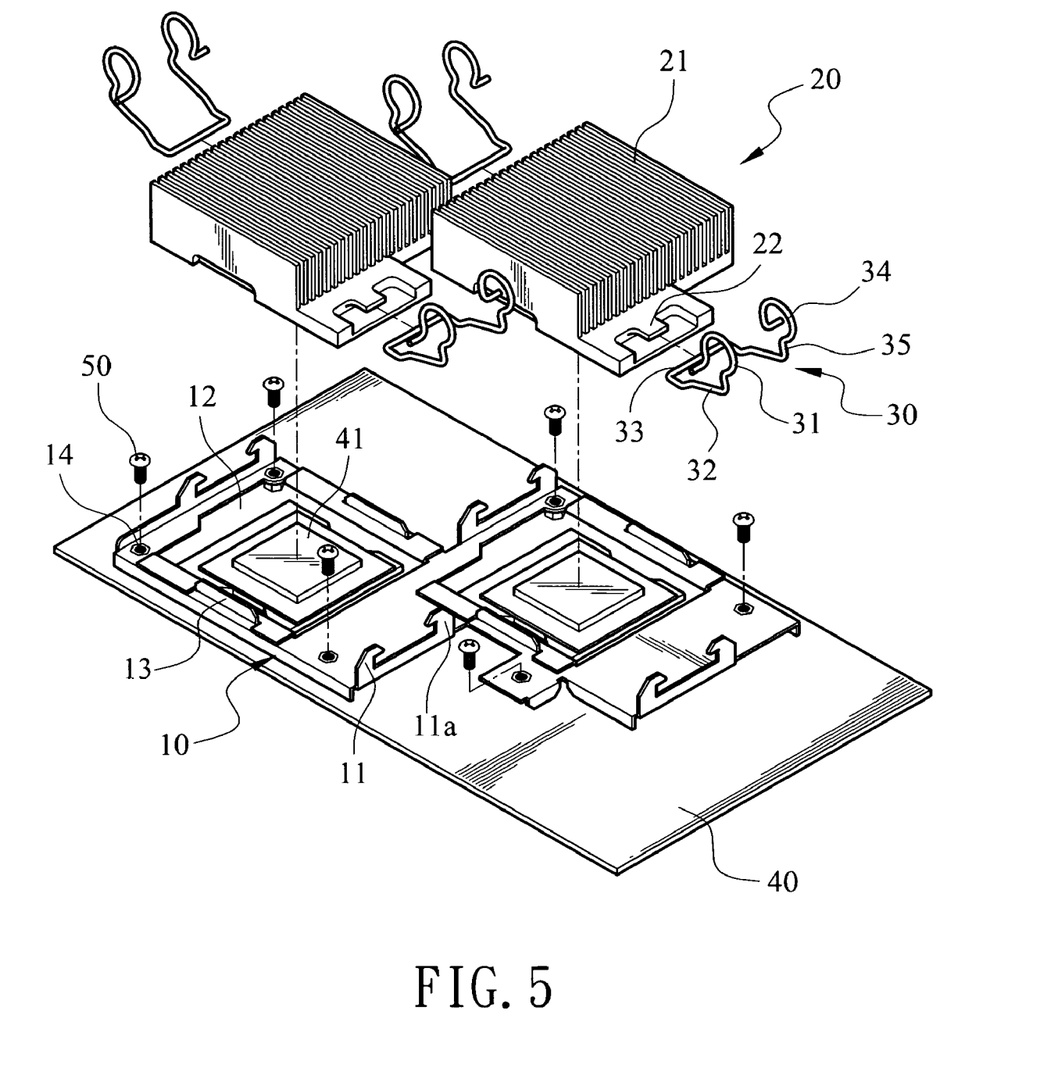
FIG. 5 is an exploded view of the second embodiment of the invention.

FIG. 5 shows an exploded view of the second embodiment. It includes a radiator frame 10, a radiator 20 and a plurality of elastic latch members 30. The radiator frame 10 is mounted onto the main board 40 corresponding to the CPU 41. It has a plurality of coupling sections 11, a plurality of another coupling sections 11a and a plurality of retaining members 13. The coupling sections 11 and the another coupling sections 11a are formed in pairs. The retaining members 13 aim to confine the radiator 20 from moving in the radiator frame 10. It also has an opening 12 corresponding to the CPU 41 and a plurality of screw holes 14. The opening 12 enables the CPU 41 to be exposed. The surface of the CPU 41 exceeds the peripheral edges of the opening 12. The screw holes 14 are coupled with screws 50 to fasten the radiator frame 10 to the main board 40.

The radiator 20 is mounted on the radiator frame 10 and is in contact with the surface of the CPU 41. It is confined by the retaining members 13 from moving. It also has a plurality of latch sections 22 corresponding to the coupling sections 11 and the another coupling sections 11a.

The elastic latch members 30 are coupled on the latch sections 22 and are bent to form respectively a force applying section 31, a latch arm 32, a swinging arm 33, an another force applying section 34 and an another latch arm 35. The force applying sections 31 and the another force applying sections 34 receive a force to turn the swinging arm 33 coupled on the latch section 22 to latch the latch arms 32 and the another latch arms 35 on the coupling sections 11 and the another coupling sections 11a thereby anchoring the radiator 20 on the radiator frame 10.

Figure 6A:
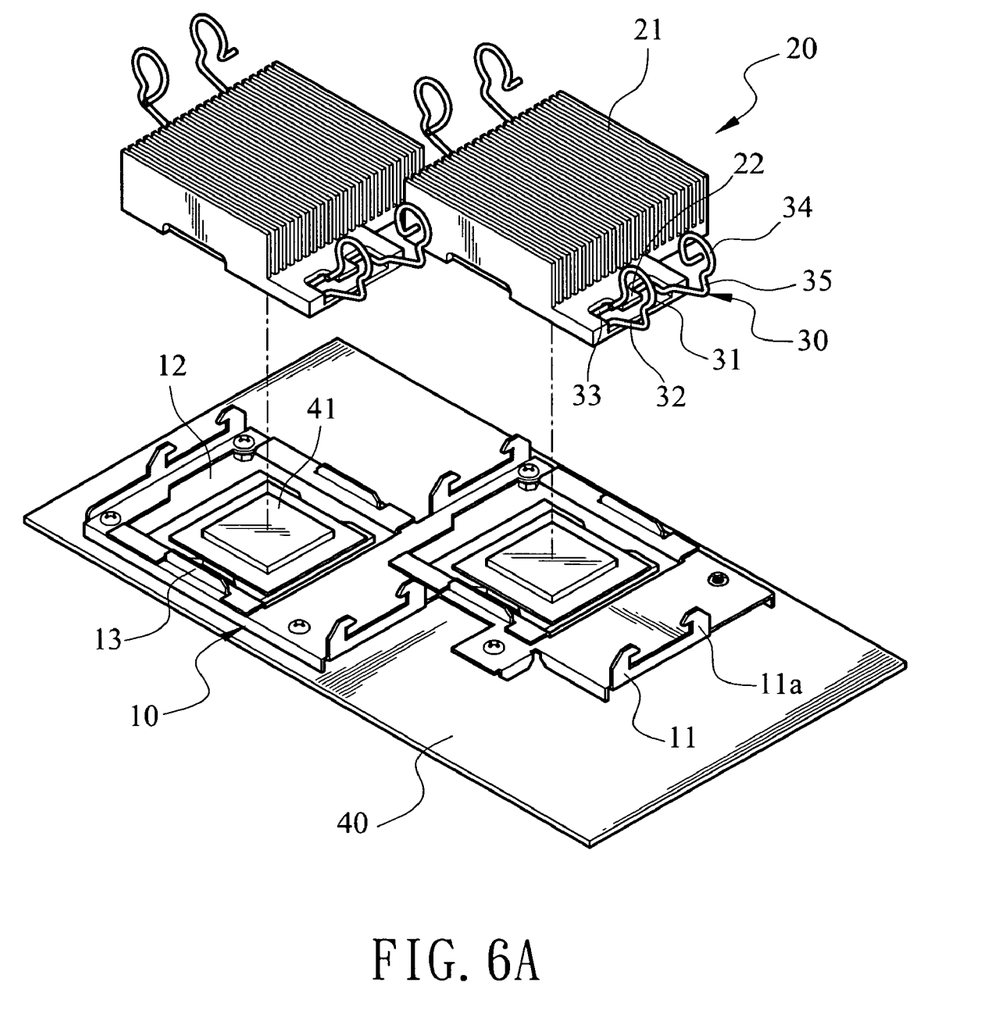
FIGS. 6A, 6B and 6C are schematic views of the second embodiment of the invention in assembly conditions.
Figure 6B:
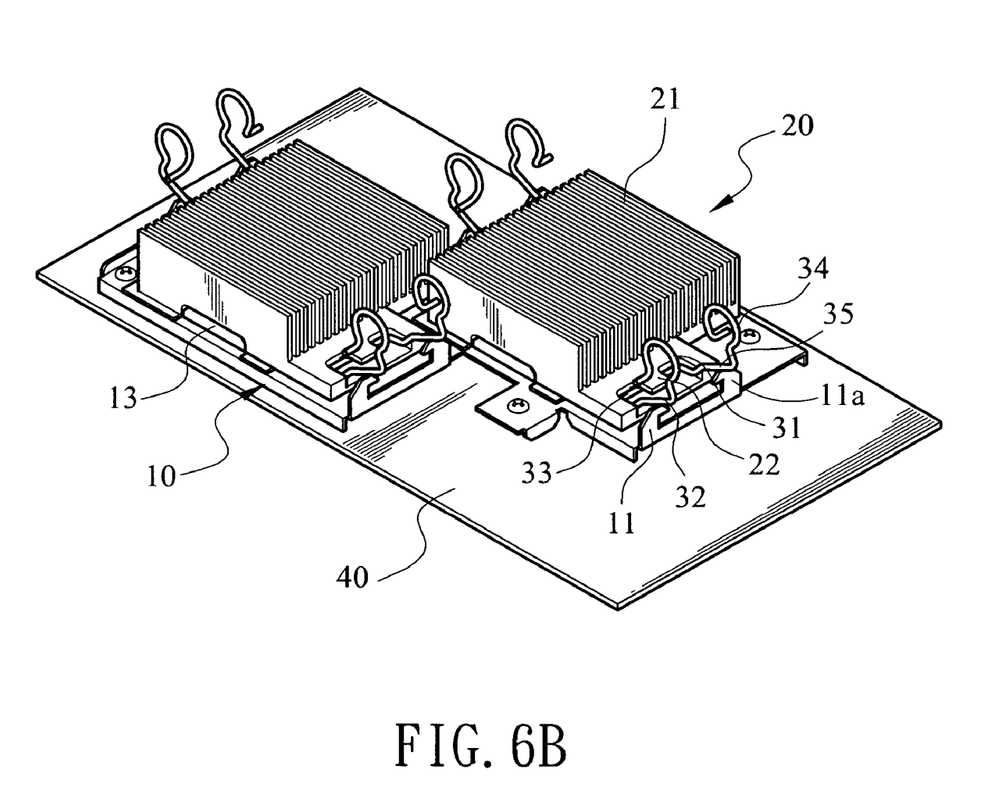
Figure 6C:
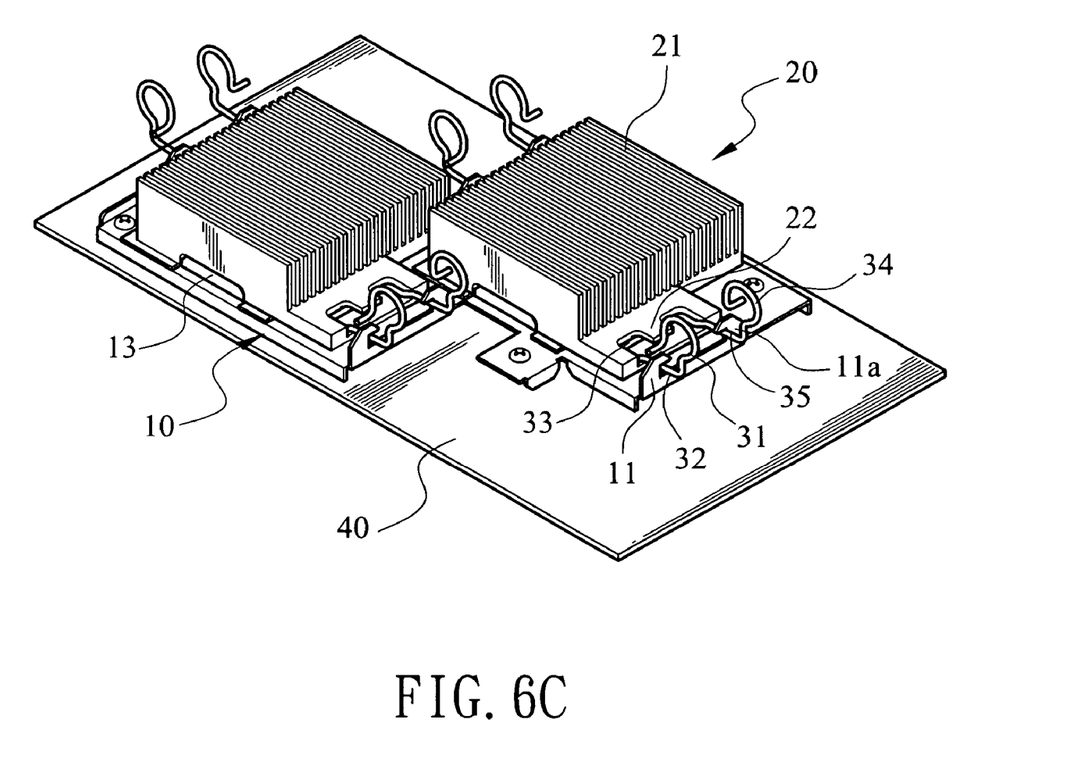

FIGS. 6A, 6B and 6C show schematic views of the second embodiment of the invention in assembly conditions. The radiator frame 10 is fastened to the main board 40 by screwing the screws 50 in the screw holes 14. The swinging arm 33 of the elastic latch member 30 is engaged with the latch section 22 of the radiator 20 in a turning manner, thereby, can fasten the radiator 20 to the radiator frame 10 and confine the radiator 20 by the retaining members 13 without moving. Exert a force on the force applying sections 31 and the another force applying sections 34 to turn the elastic latch member 30 about the swinging arm 33 and move the elastic latch member 30 towards the coupling sections 11 and the another coupling sections 11a, and latch the latch arms 32 and the another latch arms 35 on the coupling sections 11 and the another coupling sections 11a. Thereby, the radiator 20 is anchored on the radiator frame 10 and the radiator 20 is in contact with the CPU 41. Thus heat energy generated by the CPU 41 is transferred to the radiation fins 21 of the radiator 20 and dispersed.

Of course the number of the opening 12, formed on the radiator frame 10 and corresponded to the number of radiators 20, may be more than one to couple with a plurality of radiators 20 and to disperse heat energy of a plurality of CPUs 41 on the main board 40. Also, the number of the opening 12 can be one.

While the preferred embodiments of the invention have been set forth for the purpose of disclosure, modifications of the disclosed embodiments of the invention as well as other embodiments thereof may occur to those skilled in the art. Accordingly, the appended claims are intended to cover all embodiments, which do not depart from the spirit and scope of the invention.

What is claimed is:

1. A radiator structure, comprising:
    a radiator frame, mounted on a main board and corresponding to an electronic element, the radiator frame having a plurality of coupling members and an opening corresponding to the electronic element which has a surface exceeding the peripheral edges of the opening;
    a radiator, mounted on the radiator frame, being in contact with a surface of the electronic element, and having a plurality of latch sections corresponding to the coupling members; and
    a plurality of elastic latch members being coupled on the latch sections and bent to form a force applying section, a latch arm and a swinging arm, the swinging arm being pivotally engaged with the latch section and turnable after the force applying section has received a force, thereby allowing the latch arm to be latched on the coupling member to anchor the radiator on the radiator frame,
    each elastic latch member and the corresponding coupling latch section and corresponding coupling member being located at a same side of the radiator frame after the elastic latch member is pivotally engaged with the latch section.

2. The radiator structure of claim 1, wherein the radiator frame further includes another coupling member, the plurality of elastic latch members including an another force applying section and an another latch arm, such that the another latch arm is engageable with the another coupling member after the swinging arm is turned.

3. The radiator structure of claim 1, wherein the radiator frame further includes a retaining member to confine the radiator in the radiator frame from moving.

4. The radiator structure of claim 1, wherein the radiator frame further has a screw hole for fastening the radiator frame to the main board.

* * * * *